United States Patent
Uo (10) Patent No.: US 8,138,464 B2
(45) Date of Patent: Mar. 20, 2012

(54) OPTICAL RECEIVING CIRCUIT

(75) Inventor: Toyoaki Uo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 392 days.

(21) Appl. No.: 12/410,721

(22) Filed: Mar. 25, 2009

(65) Prior Publication Data

US 2010/0019132 A1    Jan. 28, 2010

(30) Foreign Application Priority Data

Jul. 24, 2008    (JP) .................................. 2008-191257

(51) Int. Cl.
*H01J 40/14*    (2006.01)

(52) U.S. Cl. ................................... 250/214 R

(58) Field of Classification Search .............. 250/214 R, 250/214 A; 330/308
See application file for complete search history.

(56) References Cited

U.S. PATENT DOCUMENTS

| 4,772,859 A | 9/1988 | Sakai |
| 7,233,209 B2 * | 6/2007 | Braier et al. ................... 330/301 |

FOREIGN PATENT DOCUMENTS

| JP | 62-005707 | 1/1987 |
| JP | 62-139403 | 6/1987 |
| JP | 63-316503 | 12/1988 |
| JP | 03-289203 | 12/1991 |
| JP | 05-121953 | 5/1993 |
| JP | 08-125619 | 5/1996 |
| JP | 2006-005761 | 1/2006 |

OTHER PUBLICATIONS

Japanese Office Action for 2008-191257 issued on Oct. 27, 2011.

* cited by examiner

*Primary Examiner* — Thanh X Luu
(74) *Attorney, Agent, or Firm* — Turocy & Watson, LLP (57) ABSTRACT

An optical-receiving circuit includes a first photodiode converting an optical signal into a current signal, a first trans-impedance amplifier to which a first power supply voltage of $V_{reg}$ is supplied and which has a negative feedback resistor and to which the current signal is input and which outputs a voltage signal, and an output circuit to which the voltage signal output from the first trans-impedance amplifier is input and which outputs a voltage signal to the outside. A temperature coefficient of a voltage of $(V_{reg} - MV_{be})$ is positive, in which $V_{be}$ is a base-emitter voltage of a transistor contained in the first trans-impedance amplifier and M is a coefficient that does not depend on the temperature.

5 Claims, 8 Drawing Sheets

OPTICAL RECEIVING CIRCUIT

CROSS-REFERENCE TO RELATED APPLICATIONS

This application is based upon and claims the benefits of priority from the prior Japanese Patent Application No. 2008-191257, filed on Jul. 24, 2008; the entire contents of which are incorporated herein by reference.

BACKGROUND OF THE INVENTION

1. Field of the Invention
This invention relates to an optical receiver.
2. Background Art
In an optically coupled device or an optical transmission device, the optical receiver which receives an optical signal and converts the optical signal to an electric signal is used.

In the optically coupled device or the optical transmission device, lowering of temperature dependency of transmission delay time and input sensitivity of the signal is required. However, these devices are composed of, a light-emitting element, an optical receiving element, a trans-impedance amplifier, a comparator circuit, an output amplifier, and so forth, and the characteristics such as transmission delay time and input sensitivity often lower with temperature rising.

There is a technology disclosure example for an optical receiver for suppressing influence of change of the surrounding temperature (JP-A 2006-5761 (Kokai)). In this technology disclosure example, a preamplifier, an average detection circuit, a voltage-current conversion circuit, and a preamplifier replica circuit are included, and the value of current split-flowing from an input part of the preamplifier is controlled to be a constant value without receiving the influence of voltage fluctuation and surrounding temperature change.

However, even when this technology disclosure example is used, the temperature dependency of the input sensitivity and the transmission delay time cannot sufficiently be reduced.

SUMMARY OF THE INVENTION

According to an aspect of the invention, there is provided an optical-receiving circuit including: a first photodiode converting an optical signal into a current signal; a first trans-impedance amplifier to which a first power supply voltage of $V_{reg}$ is supplied and which has a negative feedback resistor and to which the current signal is input and which outputs a voltage signal; and an output circuit to which the voltage signal output from the first trans-impedance amplifier is input and which outputs a voltage signal to the outside, a temperature coefficient of a voltage of ($V_{reg}-MV_{be}$) being positive, in which $V_{be}$ is a base-emitter voltage of a transistor contained in the first trans-impedance amplifier and M is a coefficient that does not depend on the temperature.

According to another aspect of the invention, there is provided an optical-receiving circuit including: a first photodiode converting an optical signal into a current signal; a first trans-impedance amplifier to which a first power supply voltage of $V_{reg}$ is supplied and which has a negative feedback resistor and to which the current signal is input and which outputs a voltage signal; a second photodiode converting an optical signal into a current signal and having an optical-shielding part; a second trans-impedance amplifier to which the first power supply voltage is supplied and having a negative feedback resistor and to which the current signal is input from the second photodiode and outputting a voltage signal; an offset generation circuit having first and second resistors and first and second current sources and applying, to the voltage signal of the first trans-impedance amplifier, a voltage generated in the first resistor by a current of the first current source and thereby outputting a first comparison voltage signal and which applies, to the voltage signal of the second trans-impedance amplifier, a voltage generated in the second resistor by a current of the second current source and thereby outputting a second comparison voltage signal; and a comparator to which the first and second comparison voltage signals are input and which outputs, to the output circuit, a signal including information for magnitude relation of the comparison voltage signals.

According to another aspect of the invention, there is provided an optical-receiving circuit including: a first photodiode converting an optical signal into a current signal; a first trans-impedance amplifier to which a first power supply voltage is supplied and having a negative feedback resistor and to which the current signal input and outputting a voltage signal; and an output circuit to which the voltage signal output from the first trans-impedance amplifier is input and outputting a voltage signal to the outside, a temperature coefficient of the first power supply voltage becoming about zero in operation.

DETAILED DESCRIPTION OF THE INVENTION

Figure 1:
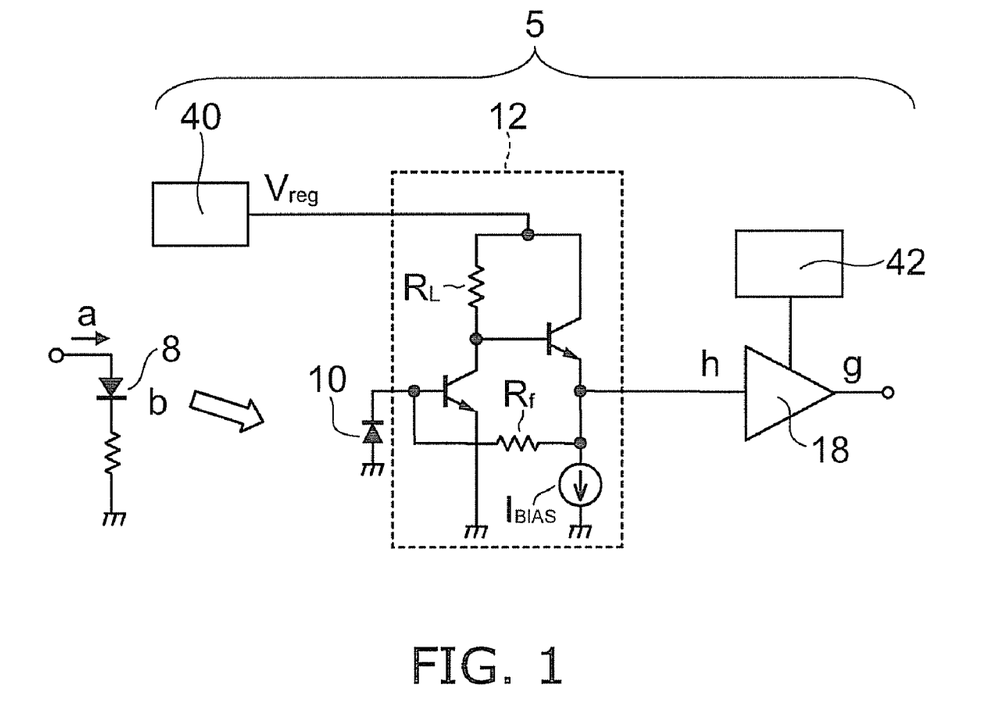
FIG. 1 is a block diagram of the optical receiver according to a first embodiment of this invention.

Hereinafter, embodiments of this invention will be described with reference to the drawings.
FIG. 1 is a block diagram of the optical receiver according to a first embodiment of this invention.
The optical receiver 5 of this embodiment includes a first photodiode 10, a first trans-impedance amplifier (TIA) 12, and an output circuit 18. The TIA 12 is driven by a voltage source 40 in which temperature dependency of the output voltage can be controlled, and the output circuit 18 is driven by a voltage source 42 in which temperature dependency of the output voltage can be controlled.

The photodiode 10 receives an optical signal b from LED 8 composing an optically coupled device and inputs a signal converted into a current to the TIA 12. The output h of the TIA 12 is amplified by the output circuit 18 and then output to the outside (g). The TIA 12 is composed of two cascade-connected transistors, a load resistor $R_L$, a feedback resistor $R_f$, and a bias current source $I_{BIAS}$.

Out of characteristics of the optical receiver 5, a transmission delay time that is the time period from inputting of the signal to outputting of the signal and an input sensitivity $If_{HL}$ represented by the value of the input signal when the output signal starts to invert are important.

First, the transmission delay time $t_T$ of the optically coupled device including delay time of LED 8 can be represented by the following formula, $$t_T = t_{LED} + t_{TIA} + t_0$$

where, $t_{LED}$: delay time of LED,
$t_{TIA}$: transmission delay time of TIA, and
$t_0$: transmission delay time of the output circuit.

Here, $t_{TIA}$ can be approximately represented by the following formula, $$t_{TIA} = K/f_c$$

where,

K: constant, and
$f_c$: cutoff frequency of TIA.

From the above-described formula, it is clear that as $f_c$ is set to be higher, $t_{TIA}$ can be shorter.

The cutoff frequency $f_c$, which is one of important characteristics of the optical receiver, can be represented by the following formula (1), $$f_c = \frac{1+|A|}{2\pi R_f C_t} \quad \text{Mathematical formula 1}$$

where, $C_t$: TIA input capacitance and photodiode capacitance,
A: TIA direct-current voltage gain, and
$R_f$: feedback resistance.

In the block diagram of FIG. 1, provided that voltage of the voltage source 40 is represented by $V_{reg}$, base-emitter forward-direction voltage is represented by $V_{be}$, and the feedback resistance $R_f$ does not depend on temperature, the formula (1) becomes the formula (2), $$f_c = \frac{1+g_m R_L}{2\pi R_f C_t kT} \quad \text{Mathematical formula 2}$$

$$\approx \frac{q(V_{reg} - 2V_{be})}{2\pi R_f C_t kT}$$

where, q: charge of electron and
k: Boltzmann constant
T: absolute temperature.

In this case, for example, if diffusion resistance is used for the feedback resistance $R_f$, its temperature coefficient becomes too large. However, when polysilicon resistance is used, its temperature coefficient can be smaller, and the resistance value can be assumed to be an approximately constant value with respect to change of absolute temperature T.

Figure 2A:
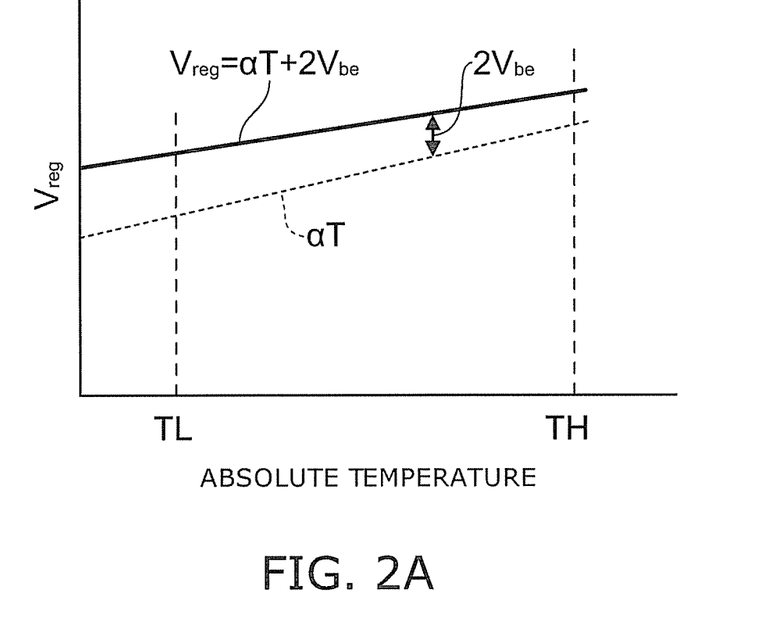
FIGS. 2A and 2B are graphic views for explaining a voltage source 40 in the first embodiment.
Figure 2B:
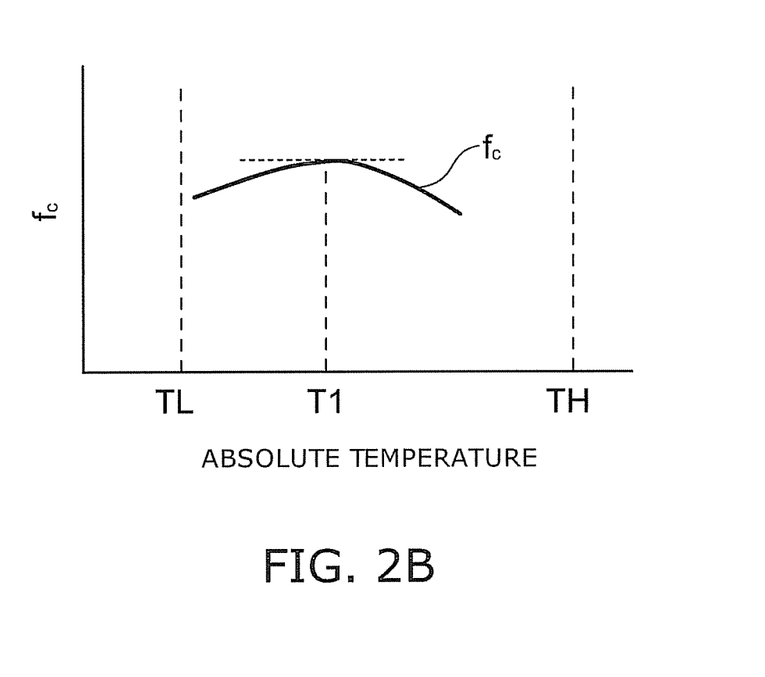

FIGS. 2A and 2B are graphic views for explaining a voltage source 40 in the first embodiment. That is, FIG. 2A represents the case that the output voltage $V_{reg}$ is approximately proportional to the absolute temperature, and FIG. 2B represents the case that the output voltage $V_{reg}$ does not depend on the temperature. The vertical axis is the output voltage $V_{reg}$ or $f_c$ and the horizontal axis is the absolute temperature T. When the operation temperature range of the optical receiver 5 is represented by absolute temperature, its lower limit value TL can be 273 K and its upper limit value TH can be 353K, for example.

In the formula (2), the denominator increases with increase of the absolute temperature T. Out of the numerator, ($V_{reg} - 2V_{be}$) is a function of the absolute temperature T, and is set to be capable of being approximately represented by, for example, the following formula in the operation temperature range (TL to TH), $$V_{reg} - 2V_{be} \approx aT + a0$$

where, a: positive temperature coefficient, and
a0: constant.

When the temperature coefficient a is set to be a>0 as shown in FIG. 2A, ($V_{reg} - 2V_{be}$) increases with increase of the absolute temperature T. When silicon is used, $dV_{be}/dT$ becomes about −2 mV/° C. and therefore $2V_{be}$ lowers in the high-temperature side. From the above, the $V_{reg}$ condition required for eliminating temperature characteristics of the cutoff frequency $f_c$ becomes the formula (3).

$$\frac{dV_{reg}}{dT} = \frac{\alpha \times T + \alpha 0}{T} + 2 \times \frac{dV_{be}}{dT} \quad \text{Mathematical formula 3}$$

By using a temperature-dependent voltage source using the pn junction forward-direction voltage of the diode or the base-emitter forward-direction voltage $V_{be}$ of the transistor or the like, the temperature coefficient a can be controlled to be positive. That is, the voltage source 40 by which the voltage of ($V_{reg} - 2V_{be}$) can be approximately represented by (aT+a0) in the entire range (TL to TH) of the operation temperature can be realized.

In FIG. 1, TIA 12 has the simplest structure, and its modified examples are also possible. In a modified example of TIA, the temperature dependency of the cutoff frequency $f_c$ can be reduced in the wide operation temperature by establishing the following formulae, $$V_{reg} - MV_{be} \approx aT + a0$$

and $$\frac{dV_{reg}}{dT} = \frac{\alpha \times T + \alpha 0}{T} + M\frac{dV_{be}}{dT}$$

where,

M: coefficient not depending on absolute temperature.

On the other hand, occasionally, it is sufficient to reduce the temperature dependency of the cutoff frequency $f_c$ in a narrower temperature range. FIG. 2B is a graphic view for explaining a modified example of the first embodiment. That is, as the power source of the trans-impedance amplifier, a band gap constant voltage source or the like is used without using the voltage of $V_{reg}$ having a temperature coefficient. Thereby, at an arbitrary temperature (T1) in the operation temperature range, the temperature coefficient of the cutoff frequency $f_c$ can be set to be zero, and the temperature dependency of the cutoff frequency $f_c$ can be reduced in the vicinity of the temperature T1.

Here, the formula (2) is differentiated by the absolute temperature T to be the formula (4).

$$\frac{df_o}{dT} = \frac{q}{2\pi k R_f C_t}\left[\frac{1}{T}\left(\frac{dV_{reg}}{dT} - 2\frac{dV_{be}}{dT}\right) - \frac{V_{reg} - 2V_{be}}{T^2}\right] \quad \text{Mathematical formula 4}$$

Now, at the temperature T1, the condition for setting $df_c/dT$ to be zero is obtained.

For example, provided that $(dV_{reg}/dT)=0$ is set at T1=300K (namely, room temperature), the condition of $V_{reg}$ for dfc/dT=0 becomes the following formula.

$$V_{reg}=2V_{be}(T=T1)-2T1(dV_{be}/dT)$$

In a general process, $V_{be}$=0.7 V, $dV_{be}/dT$=−2 mV/° C., and therefore, $V_{reg}$ (300K) becomes about 2.6 V. That is, when the voltage $V_{reg}$ is held to be constant, for example, about 2.6V without depending on temperature, the temperature coefficient of the cutoff frequency $f_c$ can be approximated to be zero in the vicinity of 300 K, and it becomes easy to reduce the temperature dependency of the cutoff frequency $f_c$.

In this embodiment, when $(V_{reg}-MV_{be})$ has a positive temperature coefficient or when $V_{reg}$ from the voltage source 40 not depending on the temperature is used, the temperature dependency of the cutoff frequency $f_c$ is reduced, and it becomes easy to reduce temperature fluctuation of the transmission delay time $t_{T1}$.

Figure 3:
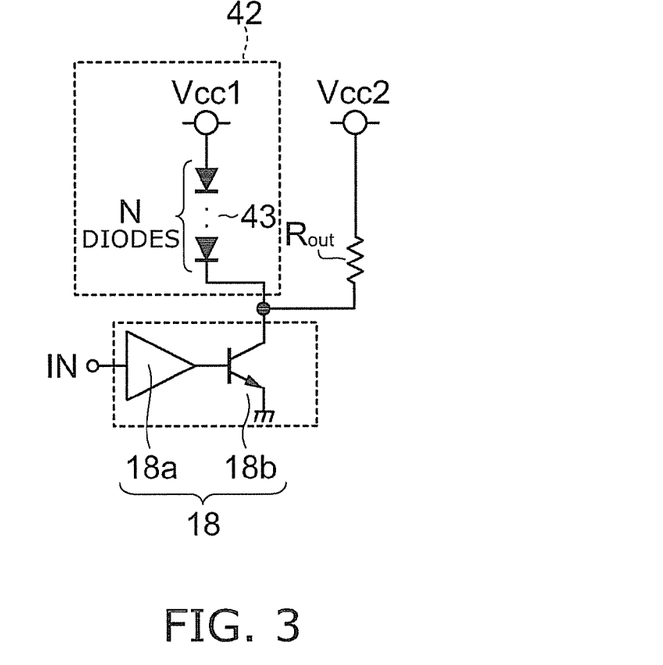
FIG. 3 is a block diagram showing an open collector type output circuit in a second embodiment.

FIG. 3 is a block diagram showing an open collector type output circuit in a second embodiment. That is, the output circuit 18 is composed of an amplifier 18a and an output transistor 18b, and the voltage source 42 has a terminal $V_{cc1}$, and $V_{cc2}$ is a power supply voltage of the next-stage circuit. In the case that only the terminal $V_{cc2}$ is provided, when the output transistor 18b is ON, the collector current is supplied from $V_{cc2}$ through the output resistance $R_{out}$, and therefore, the collector-emitter voltage $V_{ce}$ of the output transistor 18b comes to lower with lowering of the operation temperature, and the output transistor 18b becomes easy to enter the saturation region. If the output transistor 18b operates in the saturation region, because excess minority carriers are accumulated in the base region, even when the output transistor 18b is set to be in the OFF state, the ON state is held until the excess minority carriers of the base region are discharged, and the transmission delay time to of the output circuit 18 becomes longer by the time period of the ON state.

In general, among the transmission delay time $t_T$ including the delay time $t_{LED}$ of LED 8 the transmission delay time $t_0$ of the output circuit 18 is large, and therefore, it is important to reduce the transmission delay time to of the output circuit 18. If the terminal $V_{cc1}$ is provided as shown in FIG. 3, $V_{cc1}$ is supplied to the collector of the output transistor 18b through N serially connected diodes 43, and the $V_{ce}$ is represented by the following formula.

$$V_{ce}=V_{cc1}-N\times V_{be}$$

The above formula is differentiated with respect to T, and thereby, the following formula can be obtained.

$$dV_{ce}/dT=dV_{cc1}/dT-N\times dV_{be}/dT$$

If $dV_{ce}/dT=0$ can be set, $V_{ce}$ can be held to be a constant value even if temperature lowering is caused, and the output transistor 18b can be prevented from entering the saturation region. That is, this condition can be represented by the formula (5).

$$\frac{dVcc1}{dT}=N\frac{dV_{be}}{dT}$$

Mathematical formula 5

$$=N\times(-2\text{ mV/° C.})$$

Figure 4:
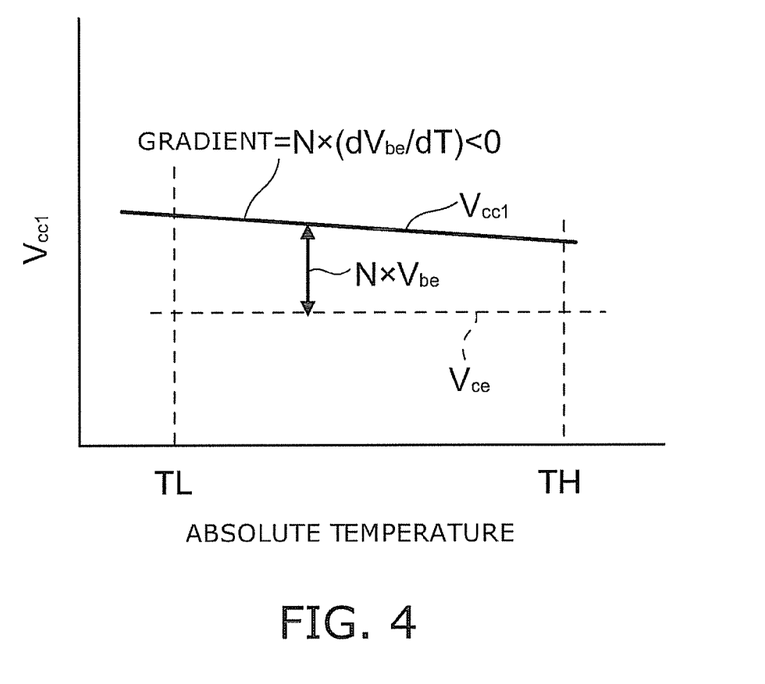
FIG. 4 is a graphic view showing absolute-temperature dependency of Vcc1 in the second embodiment.

FIG. 4 is a graphic view showing absolute-temperature dependency of $V_{cc1}$ in the second embodiment. $V_{cc1}$ has a gradient of $N\times(dV_{be}/dT)$ with respect to the absolute temperature and decreases as the absolute temperature T increases. By the temperature fluctuation of the forward-direction voltage of N serially connected diodes 43, the lowering amount of $V_{cc1}$ is cancelled, and in the ON state, the collector-emitter voltage $V_{ce}$ of the output transistor 18b can be prevented from lowering to be the saturation voltage or less. To the output transistor 18b, $V_{cc1}$ is supplied through N diodes 43, and increase of transmission delay time to of the output circuit 18 can be suppressed.

Figure 5:
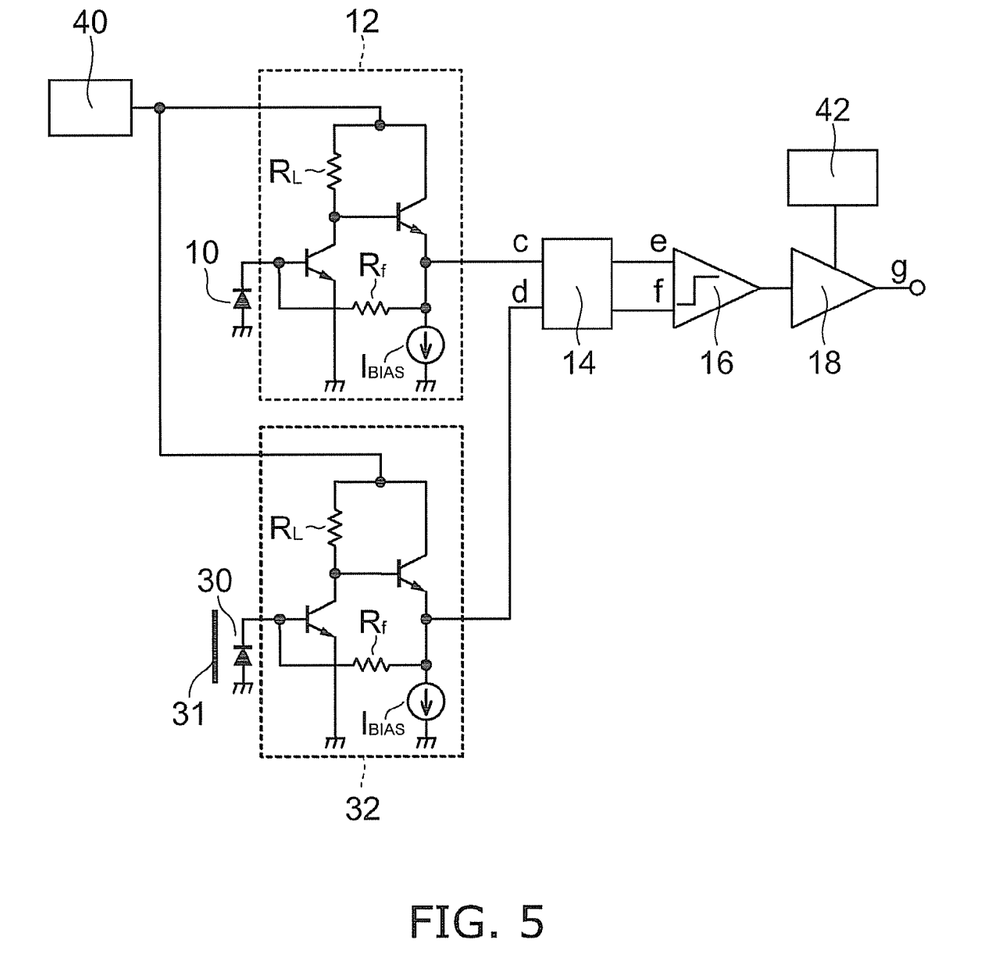
FIG. 5 is a block diagram of an optical receiver circuit according to a third embodiment.

FIG. 5 is a block diagram of an optical receiver circuit according to a third embodiment.

Figure 6:
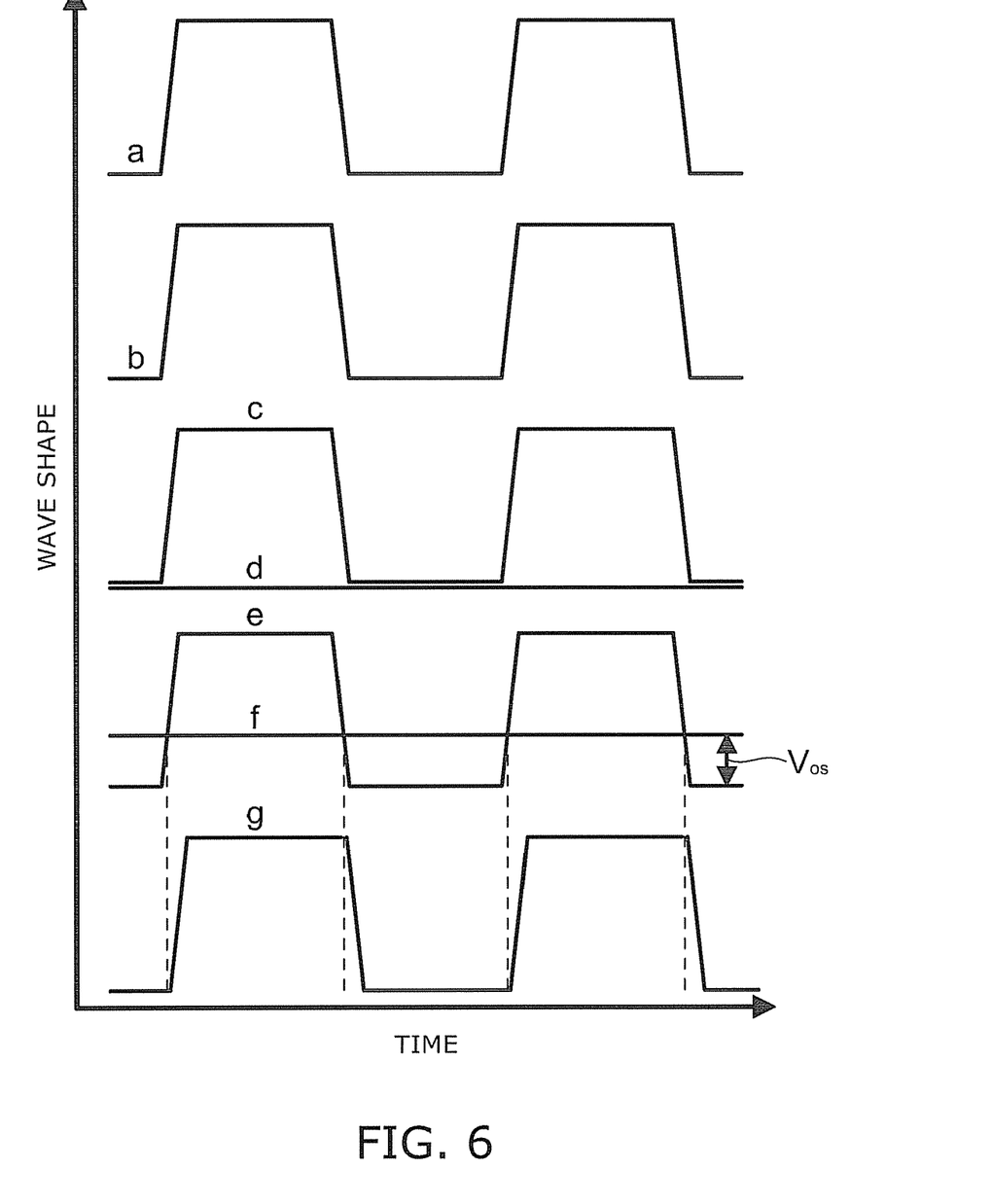
FIG. 6 shows operation wave shapes of the respective parts.

FIG. 6 shows operation wave shapes of the respective parts.

The optical receiver according to this embodiment further includes a second photodiode 30 and a second TIA 32. The respective outputs c and d of the first and second TIA 12 and 32 are input to the offset generation circuit 14, and the respective offset outputs e and f are input to a comparator 16, and the output of H level or L level is input to the output circuit 18. The second photo diode 30 is covered with an optical shielding part 31.

LED 8 is driven by the input current signal a and the optical signal b is generated. Moreover, TIA 12 generates the voltage signal c according to the optical signal b. Because the TIA 32 is covered with an optical shielding part 31, the voltage signal d is equal to the low-level of the voltage signal c. For example, the voltage signal c is lowered by the offset voltage $V_{OS}$, and thereby, the voltage signal e is generated and input to one terminal of the comparator 16. On the other hand, the output f of the offset generation circuit 14 is input to the other terminal of the comparator 16.

That is, to one input terminal of the comparator 16, the output of the first TIA 12 is input, and to the other terminal of the comparator 16, the output of the second TIA 32 is input, and the offset voltage $V_{OS}$ is generated between the two inputs, and thereby, the signal can be correctly distinguished even if there is an influence such as noise. Therefore, with reducing temperature dependency of the transmission delay time in the TIA 12 and 32 and the output circuit 18, the signal "1" or "0" having little pulse width distortion can be output as shown in the wave shape g.

In this embodiment, the entire transmission delay time $t_T$ is represented by the following formula, $$t_T=t_{LED}+t_{TIA}+t_{OS}+t_{com}+t_0$$

where, $t_{LED}$: delay time of LED,
$t_{TIA}$: transmission delay time of TIA,
$t_{OS}$: transmission delay time of the offset generation circuit,
$t_{com}$: transmission delay time of the comparator, and
$t_0$: transmission delay time of the output circuit.

In general, the transmission delay time $t_{OS}$ of the offset generation circuit and the transmission delay time $t_{com}$ of the comparator are much smaller than the entire transmission delay time.

Figure 7:
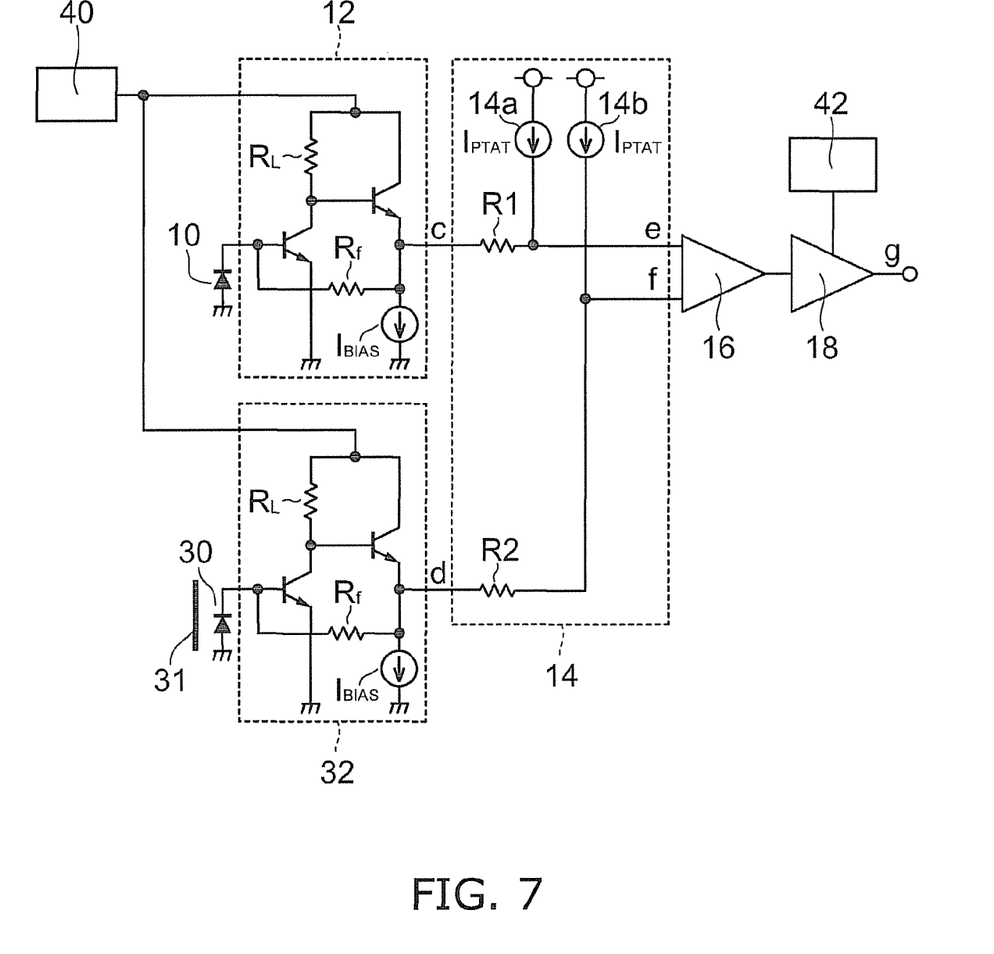
FIG. 7 is a block diagram of an optical-receiving circuit according to a fourth embodiment.

FIG. 7 is a block diagram of an optical-receiving circuit according to a fourth embodiment.

Figure 8:
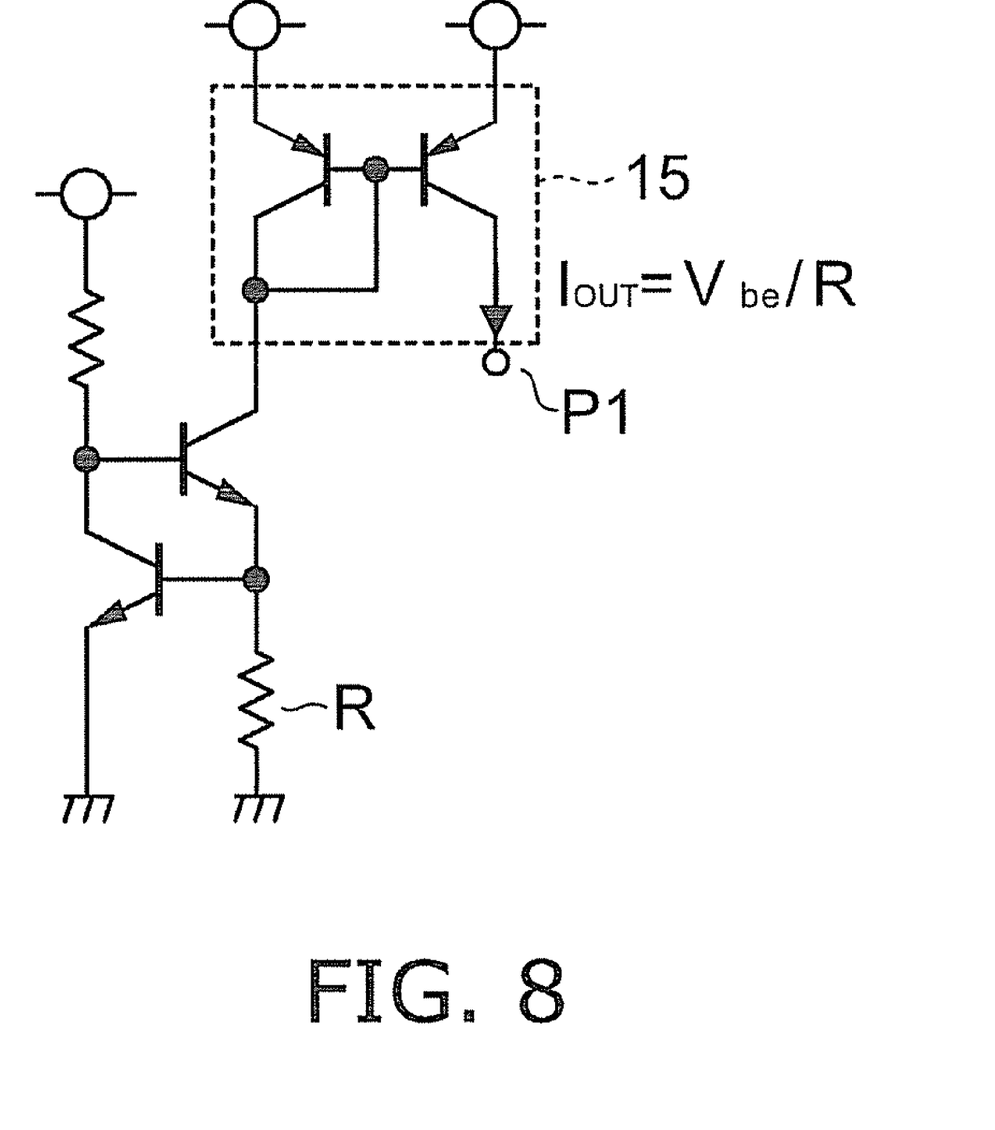
FIG. 8 shows one example of a circuit structure of the PTAT current source 14a and 14b.

In FIG. 7, the offset generation circuit 14 includes, a PTAT current source (PTAT: proportional to absolute temperature) 14a and 14b proportional to the absolute temperature T, a first resistor R1, and a second resistor R2. In this case, the current value $I_{PTAT}$ of the PTAT current source 14a and 14b is represented by the following formula, $$I_{PTAT}=B\times T+B0$$

where,

B: negative temperature coefficient,
T: absolute temperature, and
B0: constant not depending on the temperature That is, because the temperature coefficient B is negative in the PTAT current source 14a and 14b used in this embodiment, the current value $I_{PTAT}$ comes to decrease as the absolute temperature T increases. FIG. 8 shows one example of a circuit structure of the PTAT current source 14a and 14b, and the current $I_{out}=V_{be}/R$ can be taken out through a current mirror circuit 15.

The input sensitivity $If_{HL}$ that is one of important characteristics of the optical receiver is represented by the formula (6), $$If_{HL} = \frac{V_{os}}{\eta R_f Se} \quad \text{Mathematical formula 6}$$

where,
$V_{os}$: offset voltage,
$\eta$(W/A): LED luminous efficiency, and
Se(A/W): photodiode input current/LED luminescence intensity.

In general, because the luminous efficiency $\eta$ of LED lowers with temperature rising, the value of the input sensitivity $If_{HL}$ increases with temperature rising.

When the PTAT current source is used, the offset voltage $V_{OS}$ is represented by the following formula, $$V_{OS}=B \times T \times (R1-R2)+B0 \times (R1-R2)$$

where, B<0.

The offset voltage $V_{OS}$ may be generated in any one of the output c side of TIA 12 and the output d side of TIA 32.

Furthermore, when the PTAT current sources 14a and 14b proportional to $V_{be}$ as shown in FIG. 8 are used, the offset voltage $V_{OS}$ is represented by the following formula.

$$V_{OS}=C(R1-R2)V_{be}$$

C: temperature-independent constant

By using this formula, the condition that the temperature coefficient of the input sensitivity $If_{HL}$ represented by the formula (6) becomes zero is the formula (7).

$$\frac{d\eta}{dT} = \frac{\eta}{V_{be}} \frac{dV_{be}}{dT} \quad \text{Mathematical formula 7}$$

That is, when the offset generation circuit 14 is composed by using the PTAT current source, the temperature characteristics of the luminous efficiency $\eta$ of LED can be cancelled to make the temperature coefficient of the input sensitivity $If_{HL}$ smaller.

Figure 9A:
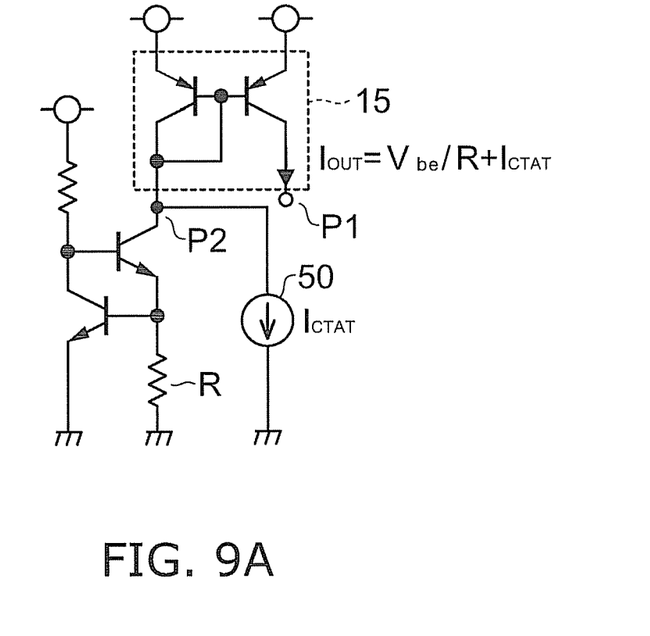
FIGS. 9A and 9B show circuit diagrams for obtaining a desired temperature coefficient by combining the PTAT current source and a CTAT current source not depending on the absolute temperature.
Figure 9B:
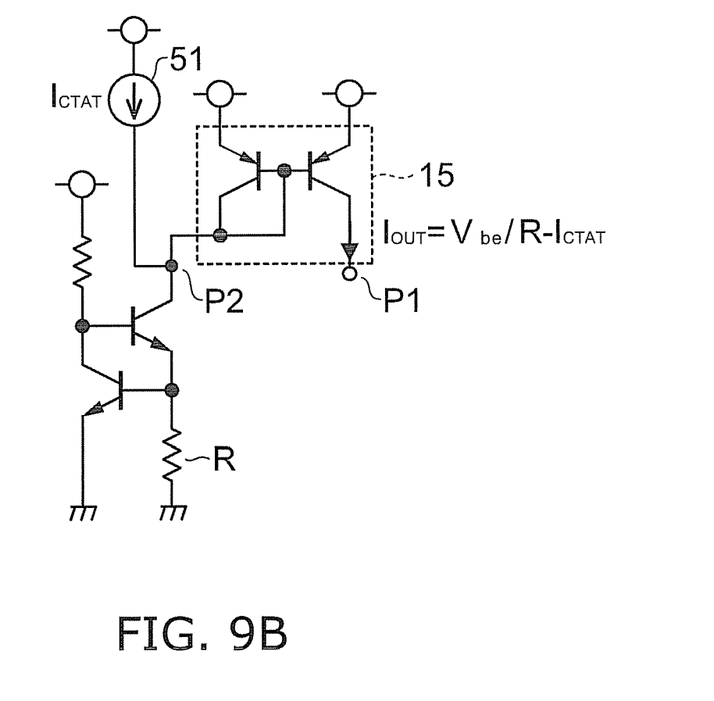

However, when the temperature coefficient of the luminous efficiency $\eta$ of LED does not satisfy the formula (7), the temperature coefficient of the input sensitivity $If_{HL}$ cannot be smaller. Accordingly, if a current source having optional temperature characteristics is used, any case of the temperature coefficient of the luminous efficiency $\eta$ of LED can be easily addressed. For example, FIGS. 9A and 9B show circuit diagrams for obtaining a desired temperature coefficient by combining the PTAT current source and a CTAT (complementary to absolute temperature) current source not depending on the absolute temperature. That is, in FIG. 9A, by providing the CTAT current source 50 between the point P2 of the current mirror circuit 15 composing the PTAT current source and the ground, $I_{out}=V_{be}/R+I_{CTAT}$ can be set. Moreover, in FIG. 9B, by providing the CTAT current source 51 between the point P2 and $V_{cc}$ power terminal, $I_{out}=V_{be}/R-I_{CTAT}$ can be set.

As described above, by adding or subtracting the CTAT current to or from the PTAT current, optional temperature characteristics can be generated in the offset voltage $V_{OS}$. The CTAT current can be generated by using a voltage source with a small temperature coefficient. As described above, the temperature dependency of the input sensitivity $If_{HL}$ can be suppressed.

As described above, by controlling the temperature dependency of the voltage source and the current source, temperature dependency of the cutoff frequency $f_c$, the transmission delay time of the output transistor, the input sensitivity $If_{HL}$, and so forth can be reduced, and even at a high temperature, increase of the transmission delay time $t_T$ can be suppressed and therewith the temperature dependency of the input sensitivity $If_{HL}$ can be reduced.

In the optically coupled device and the optical transmission device having such an optical receiver, it becomes easy to transmit data at high speed with holding the input sensitivity to be good in a wide operation temperature range in the state of insulating between the power sources between the input and the output. Therefore, they can be widely used for industrial equipment, electronics device, communication device, measuring instrument, and so forth.

As described above, embodiments of this invention has been explained with reference to drawings. However, this invention is not limited to the embodiments. Design modifications by those skilled in the art of shape, size, arrangement, and so forth of the photodiode, TIA, the offset generation circuit, the comparator, the output circuit, the voltage source, the diode, the PTAT current source, and the CTAT current source composing the optical receiver are also included in the scope of this invention as long as not departing from the spirit of this invention.

The invention claimed is:

1. An optical-receiving circuit comprising:
   a first photodiode converting an optical signal into a current signal;
   a first trans-impedance amplifier to which a first power supply voltage of $V_{reg}$ is supplied and which has a negative feedback resistor and to which the current signal is input and which outputs a voltage signal; and
   an output circuit to which the voltage signal output from the first trans-impedance amplifier is input and which outputs a voltage signal to the outside, the output circuit having an output transistor,
   a temperature coefficient of a voltage of $(V_{reg}-MV_{be})$ being positive, in which $V_{be}$ is a base-emitter voltage of a transistor contained in the first trans-impedance amplifier and M is a coefficient that does not depend on the temperature,
   a second power supply voltage being supplied to a collector of the output transistor through N (where, N≧1) diodes that are serially connected, and
   a temperature coefficient of the second power supply voltage being about N times of a temperature coefficient of the diodes.

2. The optical-receiving circuit according to claim 1, wherein the coefficient M is about 2.

3. The optical-receiving circuit according to claim 1, wherein the negative feedback resistor is composed of polysilicon.

4. The optical-receiving circuit according to claim 1, wherein the output transistor is an open collector type.

5. The optical-receiving circuit according to claim 1, further comprising:
   a second photodiode converting an optical signal into a current signal and having an optical-shielding part;

a second trans-impedance amplifier to which the first power supply voltage is supplied and which has a negative feedback resistor and to which the current signal input from the second photodiode and which outputs a voltage signal;

an offset generation circuit to which the voltage signal output from the first trans-impedance amplifier and the voltage signal output from the second trans-impedance amplifier are input and which applies an offset voltage to any one of the voltage signals and thereby outputting a first comparison voltage signal and which does not apply the offset voltage to the other voltage signal and thereby outputting a second comparison voltage signal; and a comparator to which the first comparison voltage signal and the second comparison voltage signal are input and which outputs, to the output circuit, a signal including information for magnitude relation of the comparison voltage signals.

* * * * *